(12) United States Patent
Du

(10) Patent No.: US 9,905,181 B2
(45) Date of Patent: Feb. 27, 2018

(54) ARRAY SUBSTRATE AND SCAN DRIVING CIRCUIT THEREON

(71) Applicant: Shenzhen China Star Optoelectronics Technology Co., Ltd., Shenzhen, Guangdong (CN)

(72) Inventor: Peng Du, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 253 days.

(21) Appl. No.: 14/908,066

(22) PCT Filed: Dec. 29, 2015

(86) PCT No.: PCT/CN2015/099469
§ 371 (c)(1),
(2) Date: Jan. 27, 2016

(87) PCT Pub. No.: WO2017/071079
PCT Pub. Date: May 4, 2017

(65) Prior Publication Data
US 2017/0263202 A1   Sep. 14, 2017

(30) Foreign Application Priority Data

Oct. 29, 2015   (CN) .......................... 2015 1 0716664

(51) Int. Cl.
*G09G 3/36*   (2006.01)

(52) U.S. Cl.
CPC ... *G09G 3/3677* (2013.01); *G09G 2300/0426* (2013.01); *G09G 2300/0439* (2013.01);
(Continued)

(58) Field of Classification Search
CPC ......... G09G 3/3677; G09G 2300/0809; G09G 2300/0426
See application file for complete search history.

(56) References Cited

U.S. PATENT DOCUMENTS

2008/0219401 A1* 9/2008 Tobita .................. G09G 3/3677
  377/79
2009/0135323 A1* 5/2009 Yang ................... G02F 1/13624
  349/37

(Continued)

*Primary Examiner* — Ariel Balaoing
(74) *Attorney, Agent, or Firm* — Andrew C. Cheng

(57) ABSTRACT

The present disclosure discloses a scan driving circuit on an array substrate which includes a multi-stage cascade circuit, each stage of the cascade circuit inputs a clock signal corresponding to a current stage, and outputs an current stage scanning signal and a current stage cascade signal, different stages of the cascade circuit are connected with each other via a cascade signal; a plurality of cancellation circuits, each cancellation circuit is corresponding to one stage of the cascade circuit, the cancellation circuit corresponding to the current stage cascade circuit inputs a clock signal corresponding to an adjacent stage cascade circuit, and outputs a cancellation signal to offset a part of the current stage scanning signal outputted from the current stage cascade circuit, so that the scanning signals outputted from two adjacent stages of the cascade circuit are not overlapped. An array substrate is also disclosed in the present disclosure.

19 Claims, 6 Drawing Sheets

(52) U.S. Cl.
CPC ............... *G09G 2300/0809* (2013.01); *G09G 2310/0205* (2013.01); *G09G 2320/028* (2013.01)

(56) References Cited

U.S. PATENT DOCUMENTS

2009/0243978 A1* 10/2009 Yamamoto ............ G09G 3/3233
  345/76
2013/0100007 A1* 4/2013 Yamamoto ............ G09G 3/3677
  345/100
2016/0372034 A1* 12/2016 Zhou ....................... G11C 19/28

\* cited by examiner

ARRAY SUBSTRATE AND SCAN DRIVING CIRCUIT THEREON

FIELD OF THE INVENTION

The present disclosure relates to the technical field of displays, and in particular it relates to an array substrate and scan driving circuit thereof.

BACKGROUND OF THE INVENTION

Recently, due to the advantages of high contrast, fast response time, high transmittance, and so on, vertical alignment (VA) liquid crystal technology has been widely used.

Typically, each pixel of the VA liquid crystal is divided into two regions, wherein one region (main-region) is the same with an ordinary pixel, and another region (sub-region) generates a voltage difference to the first region through circuit designs, the wide viewing angle performance of the VA liquid crystal is thereby improved. A pixel with such design is typically adopting two scan lines, wherein a first scan line charges normally to the two regions, respectively, a second scan line controls a TFT for charge sharing in the sub-region, such that the voltage difference between two pixel electrodes in the two regions is obtained.

Since the two scan lines occupied a partial space, and reduce the aperture ratio, therefore in the subsequent improvement, the second scan line is merged into the scan line of a next stage pixel, so as to improve the aperture ratio. However, under this design, the two scan lines cannot be opened at the same time, otherwise the voltage difference between the main-region and the sub-region cannot be generated, hence the purpose of improving the viewing angle cannot be achieved. In view of the GOA circuit designs to the existing large-size panel, due to the electrical load and other factors, the circuit is generally adopts multi-clock signals design such as fourth clock signals, sixth clock signals, or even eighth clock signals, such that the waveforms of current stage scanning signals between two adjacent stages are overlapped, as shown in FIG. 1, which means that the scan lines of two adjacent stages will both turn on at the same time, it is hardly to meet the driving demand for the VA liquid crystal with wide viewing angle as mentioned above.

SUMMARY OF THE INVENTION

In order to solve the above problems, the present disclosure provides a scan driving circuit on an array substrate. The scan driving circuit on an array substrate comprises: a multi-stage cascade circuit, each stage of the cascade circuit inputs a clock signal corresponding to a current stage, and outputs a current stage scanning signal and a current stage cascade signal, different stages of the cascade circuit are connected with each other via the cascade signal; a plurality of cancellation circuits, each cancellation circuit is corresponding to one stage of the cascade circuit, the cancellation circuit corresponding to a current stage cascade circuit inputs a clock signal corresponding to an adjacent stage cascade circuit, and outputs a cancellation signal, the cancellation signal offsets a part of the current stage scanning signal outputted from the current stage cascade circuit, so that the scanning signals outputted from two adjacent stages of the cascade circuit are not overlapped; a total group of the clock signals are m, wherein m is an even number, an average duty cycle of each clock signal is 50%, the current stage cascade circuit is a n-th stage, wherein n is a positive integer, the current stage cascade circuit is connected to a cascade signal ST (n−m/2) outputted from a (n−m/2) stage cascade circuit, and a cascade signal ST (n+m/2) outputted from a (n+m/2) stage cascade circuit; the cancellation circuit comprises a first transistor, a control terminal of the first transistor is connected a clock signal corresponding to the adjacent stage cascade circuit, a first connecting terminal of the first transistor is connected to a low constant potential Vss, a second connecting terminal of the first transistor is connected to the current stage scanning signal; the cascade circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal; configuring an on-resistance ratio of the output transistor and the first transistor, so that a potential of the current stage scanning signal cannot turn on a TFT that is connected to the current stage scanning signal and used for charge sharing, in a pulse duration when the clock signals corresponding to the adjacent stage and the current stage are overlapped.

In order to solve one of the above problems, the present disclosure provides a scan driving circuit on an array substrate. The scan driving circuit on the array substrate comprises: a multi-stage cascade circuit, each stage of the cascade circuit inputs a clock signal corresponding to a current stage, and outputs a current stage scanning signal and a current stage cascade signal, different stages of the cascade circuit are connected with each other via the cascade signal; a plurality of cancellation circuits, each cancellation circuit is corresponding to one stage of the cascade circuit, the cancellation circuit corresponding to a current stage cascade circuit inputs a clock signal corresponding to an adjacent stage cascade circuit, and outputs a cancellation signal, the cancellation signal offsets a part of the current stage scanning signal outputted from the current stage cascade circuit, so that the scanning signals outputted from two adjacent stages of the cascade circuit are not overlapped.

Wherein, the cancellation circuit comprises a first transistor, a control terminal of the first transistor is connected a clock signal corresponding to the adjacent stage cascade circuit, a first connecting terminal of the first transistor is connected to a low constant potential Vss, a second connecting terminal of the first transistor is connected to the current stage scanning signal.

Wherein, the cascade circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal; configuring an on-resistance ratio of the output transistor and the first transistor, so that in a pulse duration when the clock signals corresponding to the adjacent stage and the current stage are overlapped, a potential of the current stage scanning signal cannot turn on a TFT that being connected to the current stage scanning signal and used for charge sharing.

Wherein, the cancellation circuit comprises a second transistor, a third transistor, a fourth transistor, and a fifth transistor; a first connecting terminal of the second transistor is connected to the clock signal corresponding to the adjacent stage cascade circuit, a control terminal of the second transistor is connected to a first control signal, a second connecting terminal of the second transistor is connected to a control terminal of the third transistor, a first connecting terminal of the third transistor is connected to a low constant potential Vss, a second connecting terminal of the third transistor is connected to the current stage scanning signal; a first connecting terminal of the fourth transistor is connected to the clock signal corresponding to the adjacent stage cascade circuit, a control terminal of the fourth transistor is connected to a second control signal, a second connecting terminal of the fourth transistor is connected to a control terminal of the fifth transistor, a first connecting terminal of the fifth transistor is connected to the low constant potential Vss, a second connecting terminal of the fifth transistor is connected to the current stage scanning signal; wherein a phase of the first control signal and a phase of the second control signal are opposite, frequencies of the first control signal and the second control signal are smaller than that of the clock signal.

Wherein, the cascade circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal; configuring on-resistance ratios of the output transistor, the third transistor, and the fifth transistor, so that in a pulse duration when the clock signals corresponding to the adjacent stage and the current stage are overlapped, a potential of the current stage scanning signal cannot turn on a TFT that being connected to the current stage scanning signal and used for charge sharing.

Wherein, the cancellation circuit comprises a sixth transistor, a seventh transistor, an eighth transistor, and a ninth transistor; a first connecting terminal of the sixth transistor is connected to the clock signal corresponding to the adjacent stage cascade circuit, a control terminal of the sixth transistor is connected to a forward scanning signal, a second connecting terminal of the sixth transistor is connected to a control terminal of the seventh transistor, a first connecting terminal of the seventh transistor is connected to a low constant potential Vss, a second connecting terminal of the seventh transistor is connected to the current stage scanning signal; a first connecting terminal of the eighth transistor is connected to a clock signal corresponding to another adjacent stage cascade circuit, a control terminal of the eighth transistor is connected to a reverse scanning signal, a second connecting terminal of the eighth transistor is connected to a control terminal of the ninth transistor, a first connecting terminal of the ninth transistor is connected to the low constant potential Vss, a second connecting terminal of the ninth transistor is connected to the current stage scanning signal.

Wherein, the cascade circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal; configuring on-resistance ratios of the output transistor, the seventh transistor, and the ninth transistor, so that in a pulse duration when the clock signals corresponding to the adjacent stage and the current stage are overlapped, a potential of the current stage scanning signal cannot turn on a TFT that being connected to the current stage scanning signal and used for charge sharing.

Wherein, a total group of the clock signals are m, wherein m is an even number, an average duty cycle of each clock signal is 50%, the current stage cascade circuit is a n-th stage, wherein n is a positive integer, the current stage cascade circuit is connected to a cascade signal ST (n−m/2) outputted from a (n−m/2) stage cascade circuit and a cascade signal ST (n+m/2) outputted from a (n+m/2) stage cascade circuit.

In order to solve one of the above problems, the present disclosure provides an array substrate. The array substrate comprises: a scan driving circuit which comprises a multi-stage cascade circuit, each stage of the cascade circuit inputs a clock signal corresponding to a current stage, and outputs a current stage scanning signal and a current stage cascade signal, different stages of the cascade circuit are connected with each other via the cascade signal; a plurality of cancellation circuits, each cancellation circuit is corresponding to one stage of the cascade circuit, the cancellation circuit corresponding to a current stage cascade circuit inputs a clock signal corresponding to an adjacent stage cascade circuit, and outputs a cancellation signal, the cancellation signal offsets a part of the current stage scanning signal outputted from the current stage cascade circuit, so that the scanning signals outputted from two adjacent stages of the cascade circuit are not overlapped.

Wherein, the cancellation circuit of the scan driving circuit comprises a first transistor, a control terminal of the first transistor is connected a clock signal corresponding to the adjacent stage cascade circuit, a first connecting terminal of the first transistor is connected to a low constant potential Vss, a second connecting terminal of the first transistor is connected to the current stage scanning signal.

Wherein, the cascade circuit of the scan driving circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal; configuring an on-resistance ratio of the output transistor and the first transistor, so that in a pulse duration when the clock signals corresponding to the adjacent stage and the current stage are overlapped, a potential of the current stage scanning signal cannot turn on a TFT that being connected to the current stage scanning signal and used for charge sharing.

Wherein, the cancellation circuit of the scan driving circuit comprises a second transistor, a third transistor, a fourth transistor, and a fifth transistor; a first connecting terminal of the second transistor is connected to the clock signal corresponding to the adjacent stage cascade circuit, a control terminal of the second transistor is connected to a first control signal, a second connecting terminal of the second transistor is connected to a control terminal of the third transistor, a first connecting terminal of the third transistor is connected to a low constant potential Vss, a second connecting terminal of the third transistor is connected to the current stage scanning signal; a first connecting terminal of the fourth transistor is connected to the clock signal corresponding to the adjacent stage cascade circuit, a control terminal of the fourth transistor is connected to a second control signal, a second connecting terminal of the fourth transistor is connected to a control terminal of the fifth transistor, a first connecting terminal of the fifth transistor is connected to the low constant potential Vss, a second connecting terminal of the fifth transistor is connected to the current stage scanning signal; wherein a phase of the first control signal and a phase of the second control signal are opposite, frequencies of the first control signal and the second control signal are smaller than that of the clock signal Wherein, the cascade circuit of the scan driving circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal; configuring on-resistance ratios of the output transistor, the third transistor, and the fifth transistor, so that in a pulse duration when the clock signals corresponding to the adjacent stage and the current stage are overlapped, a potential of the current stage scanning signal cannot turn on a TFT that being connected to the current stage scanning signal and used for charge sharing.

Wherein, the cancellation circuit of the scan driving circuit comprises a sixth transistor, a seventh transistor, an eighth transistor, and a ninth transistor; a first connecting terminal of the sixth transistor is connected to the clock signal corresponding to the adjacent stage cascade circuit, a control terminal of the sixth transistor is connected to a forward scanning signal, a second connecting terminal of the sixth transistor is connected to a control terminal of the seventh transistor, a first connecting terminal of the seventh transistor is connected to a low constant potential Vss, a second connecting terminal of the seventh transistor is connected to the current stage scanning signal; a first connecting terminal of the eighth transistor is connected to a clock signal corresponding to another adjacent stage cascade circuit, a control terminal of the eighth transistor is connected to a reverse scanning signal, a second connecting terminal of the eighth transistor is connected to a control terminal of the ninth transistor, a first connecting terminal of the ninth transistor is connected to the low constant potential Vss, a second connecting terminal of the ninth transistor is connected to the current stage scanning signal.

Wherein, the cascade circuit of the scan driving circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal; configuring on-resistance ratios of the output transistor, the seventh transistor, and the ninth transistor, so that in a pulse duration when the clock signals corresponding to the adjacent stage and the current stage are overlapped, a potential of the current stage scanning signal cannot turn on a TFT that being connected to the current stage scanning signal and used for charge sharing.

Wherein, a total group of the clock signals are m, wherein m is an even number, an average duty cycle of each clock signal is 50%, the current stage cascade circuit is a n-th stage, wherein n is a positive integer, the current stage cascade circuit is connected to a cascade signal ST (n−m/2) outputted from a (n−m/2) stage cascade circuit and a cascade signal ST (n+m/2) outputted from a (n+m/2) stage cascade circuit.

Wherein, the array substrate further comprises a plurality of pixels arranged in array, each of the pixels comprises a main-region and a sub-region, the main-region comprises a first pixel electrode and a first TFT, the sub-region comprises a second pixel electrode, a coupling capacitor, a second TFT, and a third TFT; in the main-region of each pixel, a control terminal of the first TFT is connected to the current stage scanning signal outputted from the cascade circuit corresponding to a row where the pixel is disposed, a first connecting terminal of the first TFT is connected to a data line corresponding to a column where the pixel is disposed, a second connecting terminal of the first TFT is connected to the first pixel electrode; in the sub-region of each pixel, a control terminal of the second TFT is connected to the current stage scanning signal outputted from the cascade circuit corresponding to the row where the pixel is disposed, a first connecting terminal of the second TFT is connected to the data line corresponding to the column where the pixel is disposed, a second connecting terminal of the second TFT is connected to the second pixel electrode and a first connecting terminal of the third TFT, a control terminal of the third TFT is connected to a scanning signal outputted from a cascade circuit corresponding to a row next to the row where the pixel is disposed, a second connecting terminal of the third TFT is connected to the coupling capacitor.

Wherein, the array substrate further comprises scan lines corresponding to the pixels, the control terminal of the first TFT in each pixel and the control terminal of the third TFT in all the pixels on a row previous to the row where the pixel is disposed are connected to the current stage scanning signal outputted from the cascade circuit corresponding to the row where the pixel is disposed, via the same scan line.

The beneficial effect of the present disclosure is: in a pulse duration when the clock signals corresponding to the current stage cascade circuit and the adjacent stage cascade circuit are overlapped, that is, the cancellation signal outputted from the cancellation circuit offsets the current stage scanning signal when the clock signal corresponding to the current stage cascade circuit and the clock signal corresponding to the adjacent stage cascade circuit are both high potentials, i.e., the current stage scanning signal is dropped down from a high potential to a low potential, so that the scanning signals outputted from the two adjacent stages of the cascade circuit will not be overlapped, therefore, a VA liquid crystal with wide viewing angle can be driven without changing the clock signals.

DETAILED DESCRIPTION OF THE PREFERRED EMBODIMENTS

The following descriptions of the respective embodiments are specific embodiments capable of being implemented as illustrations of the present disclosure.

Figure 1:
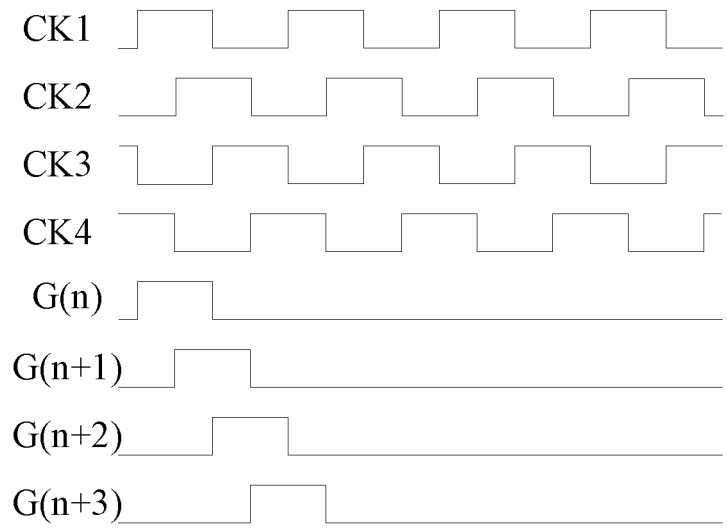
FIG. 1 is a timing diagram of a GOA circuit having four clock signals provided by the present disclosure.
Figure 2:
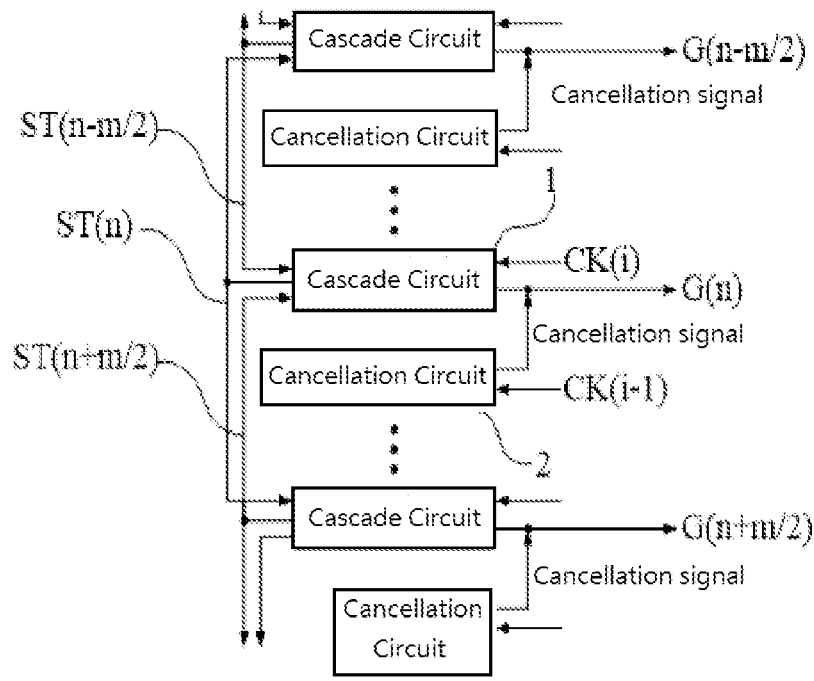
FIG. 2 is a schematic diagram of a scan driving circuit according to a first preferred embodiment of the present disclosure.

As shown in FIG. 2, the scan driving circuit according to a first preferred embodiment of the present disclosure comprises: a multi-stage cascade circuit 1, a plurality of cancellation circuits 2, each cancellation circuits is corresponding to one stage of the cascade circuit 1. The scan driving circuit of the present embodiment is disposed on an array substrate, and used for inputting a current stage cascade scanning signal to pixels via scan lines. Each stage of the cascade circuit 1 inputs a clock signal CK(i) corresponding to the current stage, and outputs a current stage scanning signal G(n) and a current stage cascade signal ST(n), different stages of the cascade circuit are connected with each other via a cascade signal.

The clock signal is typically a square wave, the current stage scanning signal G(n) is used to control the pixels, during a scanning process of a one frame image, the current stage scanning signal only requires one pulse, thus the cascade circuit is necessary to access a previous stage cascade signal and a next stage cascade signal to control the current stage scanning signal G(n). The previous stage cascade signal is a cascade signal ST(n−j) outputted from the n−j stage cascade circuit, the next stage cascade signal is a cascade circuit signal ST(n+j) outputted from the n+j stage cascade circuit, wherein j is calculated based on the group number and the duty cycle of the clock signal.

In one embodiment of the present disclosure, a total group of the clock signals are m, wherein m is an even number, an average duty cycle of each clock signal is 50%, it can be calculated that j=m/2. The previous stage cascade signal is ST (n−m/2), the next stage cascade signal is ST (n+m/2), wherein n is a positive integer. For example, when six groups of clock signals are adopted, the previous cascade signal is ST (n−3), the next cascade signal is ST (n+3).

The cancellation circuit 2 inputs a clock signal corresponding to an adjacent stage cascade circuit, the cancellation circuit offsets a part of the current stage cascade scanning signal outputted from the current stage cascade circuit, so that the scanning signals outputted from two adjacent stages of the cascade circuit are not overlapped.

As shown in the FIG. 2, the clock signal corresponding to the adjacent stage cascade circuit is refer to the clock signal corresponding to the previous stage cascade circuit, that is CK(i−1), or CK(i+1). Take the cancellation circuit 2 that inputs CK(i−1) for example, the pulses of CK(i−1) and CK(i) are partially overlapped, generally, in one pulse cycle, the time that CK(i−1) being increased from low potential to high potential, and the time that CK(i−1) being lowered from high potential to low potential are both earlier than that of CK(i). The cancellation signal outputted from the cancellation circuit 2 offsets the current stage scanning signal G(n) in a front half of the pulse duration when the pulses of CK(i) and CK(i−1) are overlapped. When the cancellation circuit inputs CK(i+1), then the current stage scanning signal G(n) is offset in a last half of the pulse duration when the pulses of CK(i) and CK(i−1) are overlapped.

The clock signal accesses to the cascade circuit 1 sequentially. Suppose a total group of the clock signals are m, when CK(i) is set for the first group of the clock signal, CK(i−1) is refer to a m-th group of clock signal; when CK (i) set for the m-th group of the clock signal, CK(i+1) is refer to the first group of the clock signal.

In a pulse duration when the clock signals corresponding to the current stage cascade circuit and the adjacent stage cascade circuit are overlapped, i.e., when the clock signal corresponding to the current stage cascade circuit and the clock signal corresponding to the adjacent stage cascade circuit are both high potentials, the cancellation signal outputted from the cancellation circuit offsets the current stage scanning signal, that is, the current stage scanning signal is lowered from high potential to low potential, the scanning signals outputted from two adjacent stages of the cascade circuit are not overlapped, the VA liquid crystal with wide viewing angle can be driven without changing the clock signals by implementing the above-described embodiment.

Figure 3:
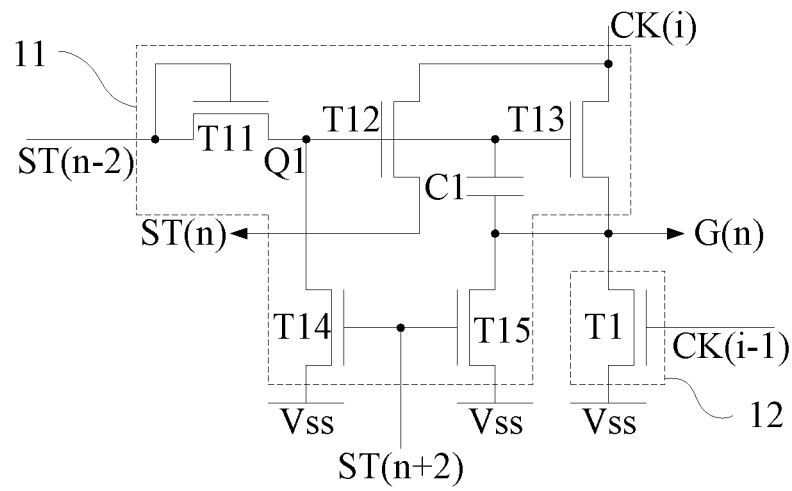
FIG. 3 is a circuit diagram of a scan driving circuit according to a second preferred embodiment of the present disclosure
Figure 4:
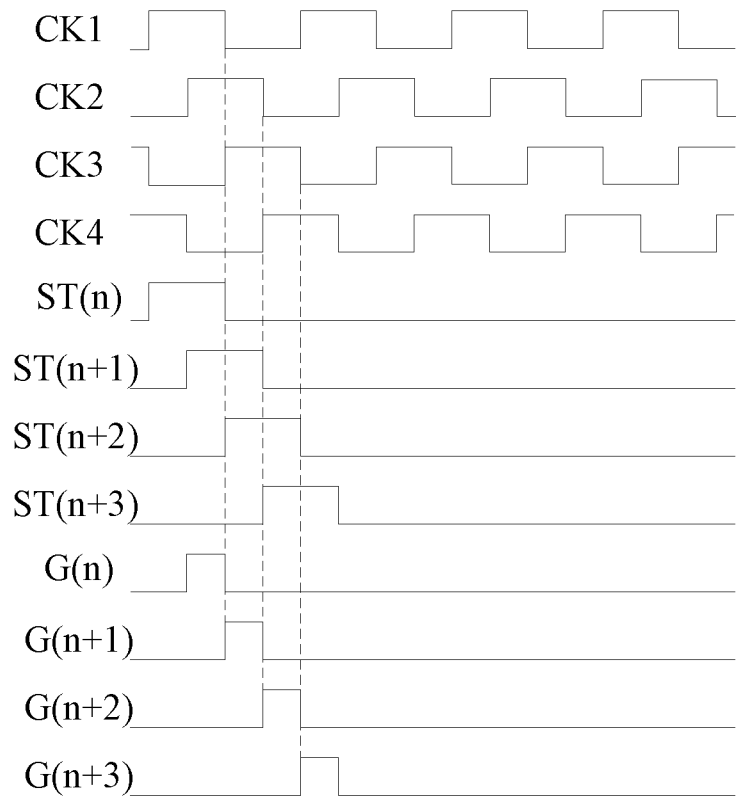
FIG. 4 is a timing diagram of a cancellation circuit being accessed to CK(i−1) according to a second preferred embodiment of a scan driving circuit in the present disclosure.
Figure 5:
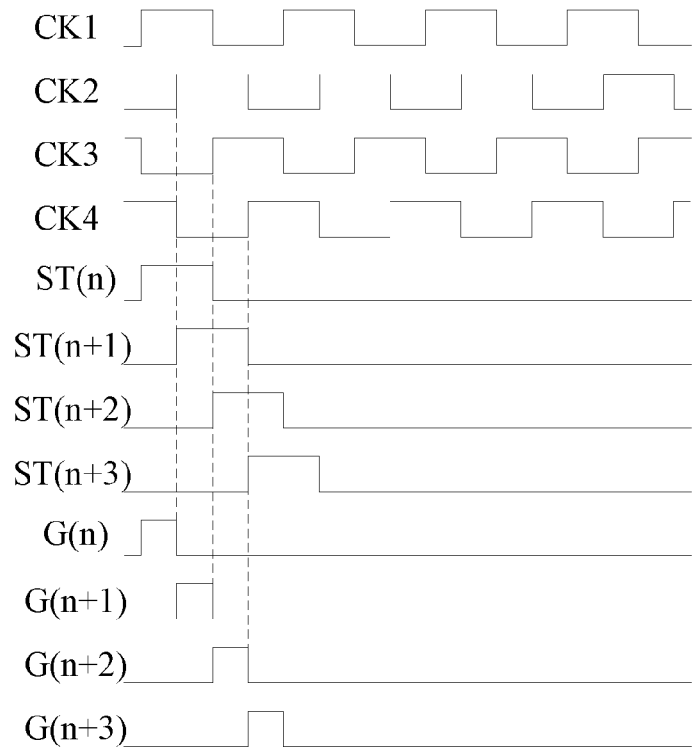
FIG. 5 is a timing chart of a cancellation circuit being accessed to CK(i+1) according to a second preferred embodiment of a scan driving circuit in the present disclosure.

Please link to FIGS. 3, 4, and 5, the second preferred embodiment of the scan driving circuit in the present disclosure comprises a multi-stage cascade circuit and the corresponding cancellation circuits, FIGS. 3 to 5, only show a cascade circuit 11 and a corresponding cancellation circuit 12, please refer to FIG. 2 for the connections between different stages of the cascade circuit.

The cascade circuit 11 comprises a eleventh transistor T11, a twelfth transistor T12, a thirteenth transistor T13, a fourteenth transistor T14, a fifteenth transistor T15, and a bootstrap capacitor. A first connecting terminal and a control terminal of the eleventh transistor T11 are connected to a previous stage cascade signal, a second connecting terminal of the eleventh transistor T11 is connected to a control node Q1. A control terminal of the twelfth transistor T12 is connected to the control node Q1, a first connecting terminal of the twelfth transistor T12 is connected to a clock signal CK(i), a second connecting terminal of the twelfth transistor T12 outputs a current stage cascade signal ST(n).

A control terminal of the thirteenth transistor T13 is connected to the control node Q1, a first connecting terminal of the thirteenth transistor T13 is connected to the clock signal CK(i), a second connecting terminal of the thirteenth transistor T13 outputs a current stage scanning signal G(n). One end of the bootstrap capacitor C1 is connected to the control node Q1, another end of the bootstrap capacitor C1 is connected to the current stage scanning signal G(n). There are four groups of the clock signals being used in the present embodiment, an average duty cycle is 50%, it can be calculated that j=2, and a previous stage cascade signal is ST(n−2).

A control terminal of the fourteenth transistor T14 is connected to a next stage cascade signal ST(n+2), a first connecting terminal of the fourteenth transistor T14 is connected to a low constant potential Vss, a second connecting terminal of the fourteenth transistor T14 is connected to the control node Q1. A control terminal of the fifteenth transistor T15 is connected to the next stage cascade signal ST(n+2), a first connecting terminal of the fifteenth transistor T15 is connected to the low constant potential Vss, a second connecting terminal of the fifteenth transistor T15 is connected to the current stage scanning signal G(n).

The cancellation circuit 12 comprises a first transistor T1, a control terminal of the first transistor T1 is connected to CK(i−1), a first connecting terminal of the first transistor T1 is connected to the low constant potential Vss, a second connecting of the first transistor T1 is connected to the current stage scanning signal G(n). The corresponding timing diagram is shown in FIG. 4.

Wherein the control terminals of the transistors are gates. If the transistors are symmetrical, then the first connecting terminals are sources, the second connecting terminals are drains; or the first connecting terminals are drains, and the second connecting terminals are sources. If the transistors are not symmetrical, then the first connecting terminals are sources, the second connecting terminals are drains.

As shown in FIG. 4, take G(n+2) for example, a front half of the positive pulse of CK3 and a last half of the positive pulse of CK2 are overlapped, in the overlapping pulse duration, the current stage scanning signal G(n+2) is dropped down to Vss by the first transistor, hence, G(n+2) and G(n+1) are not overlapped. The scanning signals outputted from the other adjacent stages of the cascade circuit are also operated in the same manner.

As shown in FIG. 4, the cancellation circuit 12 can be connected to CK(i−1), as well as being connected to CK(i+1), the current stage scanning signal G(n) is dropped down to Vss during the last half of CK(i). In the meantime, the fifteenth transistor T15 which is used to drop down the current stage scanning signal can be removed, a corresponding timing diagram is shown in FIG. 5

Figure 6:
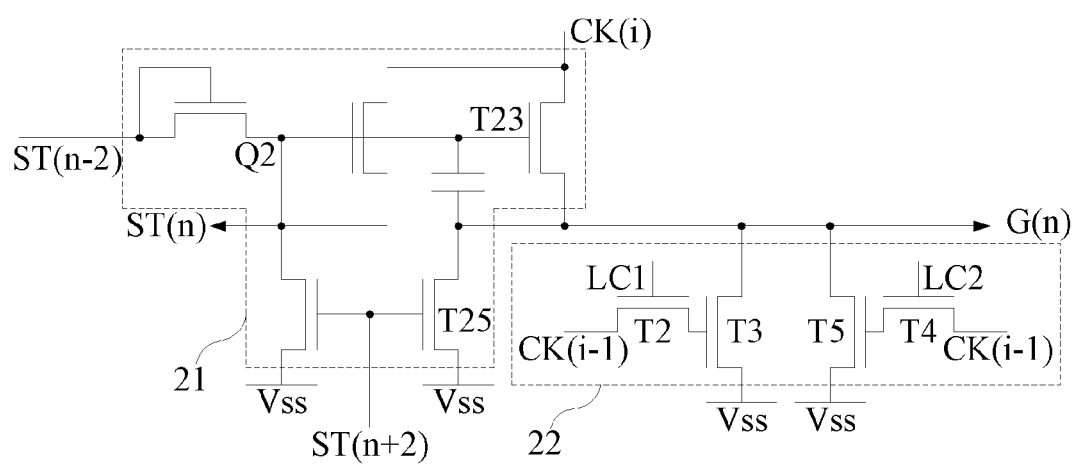
FIG. 6 is a circuit diagram of a scan driving circuit according to a third preferred embodiment of the present disclosure.

As shown in FIG. 6, a third preferred embodiment of the scan driving circuit in the present disclosure is based on the first preferred embodiment of the scan driving circuit in the present disclosure, and by further accessing the first control signal LC1 and the second control signal LC2 to the cancellation circuit 22. There are only one cascade circuit 21 and one corresponding cancellation circuit 22 being illustrated in FIG. 6, please refer to FIG. 2 for the connections between different stages of the cascade circuit.

The elements and their connections in the cascade circuit 21 please refer to the description of the second preferred embodiment of the scan driving circuit in the present disclosure. The present embodiment also adopts four groups of the clock signals, an average duty cycle is 50%. The cancellation circuit 22 comprises a second transistor T2, a third transistor T3, a fourth transistor T4, and a fifth transistor T5.

A first connecting terminal of the second transistor T2 is connected to CK(i−1), a control terminal of the second transistor T2 is connected to the first control signal LCL, a second connecting terminal of the second transistor T2 is connected to a control terminal of the third transistor T3. A first connecting terminal of the third transistor T3 is connected to a low constant potential Vss, a second connecting terminal of the third transistor T3 is connected to a current stage scanning signal G(n).

A first connecting terminal of the fourth transistor T4 is connected to CK(i−1), a control terminal of the fourth transistor T4 is connected to a second control signal LC2, a second terminal of the fourth transistor T4 is connected to a control terminal of the fifth transistor T5. A first connecting terminal of the fifth transistor T5 is connected to the low constant potential Vss, a second connecting terminal of the fifth transistor T5 is connected to the current scanning signal G(n).

Wherein, the control terminals of the transistors are gates. If the transistors are symmetrical, then the first connecting terminals are sources, the second connecting terminals are drains; or the first connecting terminals are drains, and the second connecting terminals are sources. If the transistors are not symmetrical, then the first connecting terminals are sources, the second connecting terminals are drains.

The phase of the first control signal LC1 and the phase of the second control signal LC2 are opposite, the frequencies of the first control signal LC1 and the second control signal LC2 are smaller than that of the clock signal. For example, the high/low potential of the LC1 and LC2 are switched once per frame duration, the LC1 is dropped down by T3 when it is in high potential, in this moment, LC2 is in low potential, T5 is off and will not carry out any action. In next frame, LC1 is in low potential, T3 is off, and LC1 is dropped down by T5. Please refer to FIG. 4 for the timing diagram.

The cancellation circuit 22 in the FIG. 6 can be connected to CK(i−1), as well as being connected to CK(i+1), at this time the twenty-fifth transistor T25 used to drop down the current stage scanning signal G(n) can be removed, please refer to FIG. 5 for the timing diagram.

The control terminal in any one of the transistors of the cancellation circuit 22 will not directly connected to a high frequency clock signal, thus it will not be influenced by the high frequency signal, the reliability of the circuit can therefore be improved by implementing the above-described embodiment.

Figure 7:
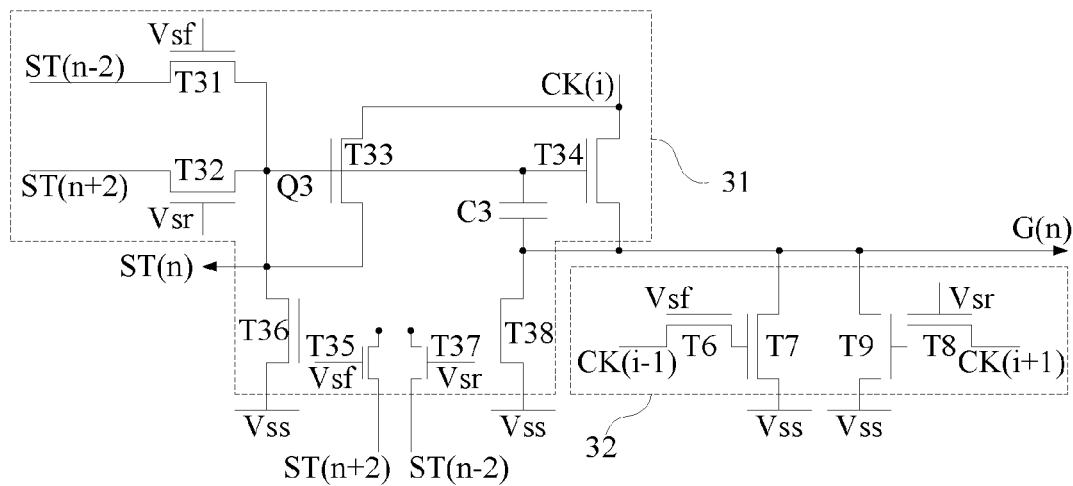
FIG. 7 is a circuit diagram of a scan driving circuit according to a fourth preferred embodiment of the present disclosure.
Figure 8:
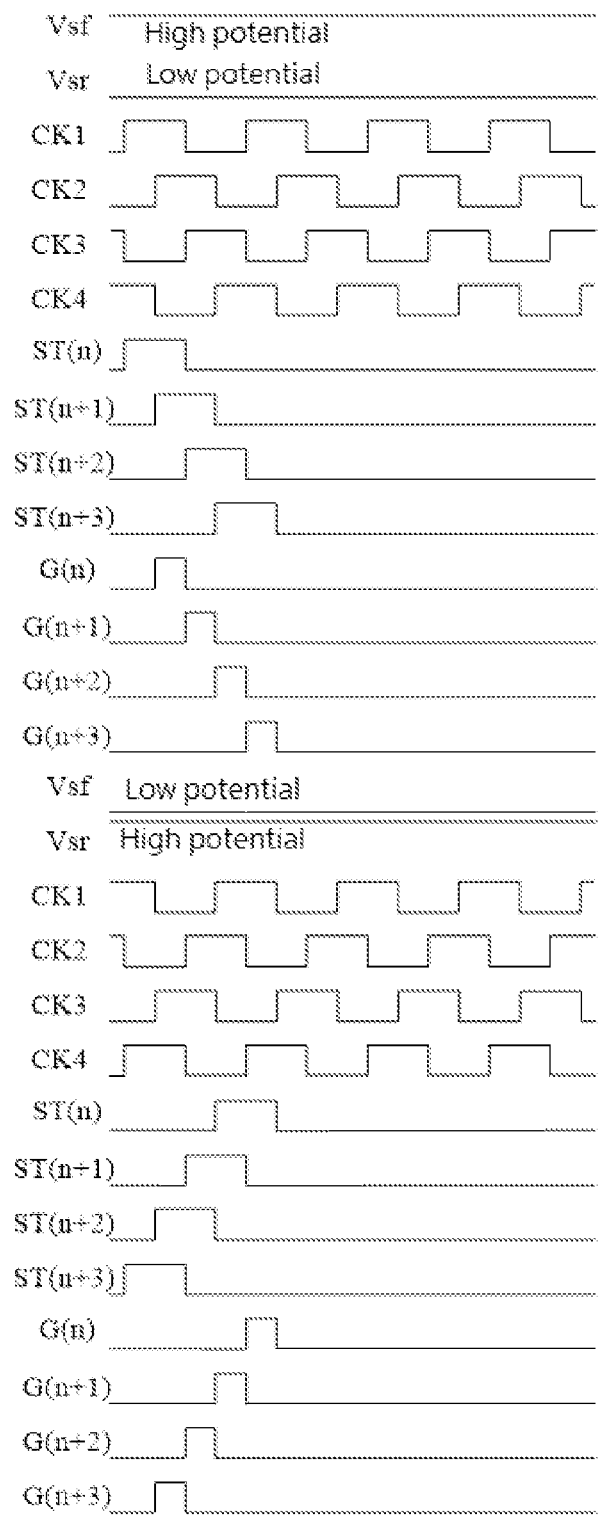
FIG. 8 is a timing diagram of a scan driving circuit according to a fourth preferred embodiment of the present disclosure.

Please link to FIGS. 7 and 8, a fourth preferred embodiment of the scan driving circuit in the present disclosure is based the first preferred embodiment of the scan driving circuit in the present disclosure, and by further accessing a forward scanning signal Vsf and a reverse scanning signal Vsr. The present embodiment also adopts four groups of the clock signals, an average duty cycle is 50%. FIGS. 7 and 8 only show a cascade circuit 31 and a corresponding cancellation circuit 32, please refer to FIG. 2 for the connections between different stages of the cascade circuit.

The cascade circuit 31 comprises a thirty-first transistor T31, a thirty-second transistor T32, a thirty-third transistor T33, a thirty-fourth transistor T34, a thirty-fifth transistor T35, a thirty-sixth transistor T36, a thirty-seventh transistor T37, a thirty-eighth transistor T38, and a bootstrap capacitor C2.

A first connecting terminal of the thirty-first transistor T31 is connected to a previous stage cascade signal ST(n−2), a control terminal of the thirty-first transistor T31 is connected to the forward scanning signal Vsf, a second connecting terminal of the thirty-first transistor T31 is connecting to a control node Q3. A first connecting terminal of the thirty-second transistor T32 is connected to a next stage cascade signal ST(n+2), a control terminal of the thirty-second transistor T32 is connected to the reverse scanning signal Vsr, a second connecting terminal of the thirty-second transistor T32 is connected to the control node Q3.

A control terminal of the thirty-third transistor T33 is connected to the control node Q3, a first connecting terminal of the thirty-third transistor T33 is connected to the clock signal CK(i), a second connecting terminal of the thirty-third transistor T33 outputs a current stage cascade signal ST(n). A control terminal of the thirty-fourth transistor T34 is connected to the control node Q3, a first connecting terminal of the thirty-fourth transistor T34 is connected to a clock signal CK(i), a second connecting terminal of the thirty-fourth transistor T34 is connected to the current stage scanning signal G(n). One end of the bootstrap capacitor C3 is connected to the control node Q3, another end of the bootstrap capacitor is connected to the current stage scanning signal G(n).

A first connecting terminal of the third-fifth transistor T35 is connected to the next stage cascade signal ST(n+2), a control terminal of the third-fifth transistor T35 is connected to the forward scanning signal Vsf, a second connecting terminal of the third-fifth transistor T35 is connected to a control terminal of the thirty-sixth transistor T36. A first connecting terminal of the thirty-sixth transistor T36 is connected to a low constant potential Vss, a second connecting terminal of the thirty-sixth transistor T36 is connected to the control node Q3. A first connecting transistor of the thirty-seventh transistor T37 is connected to the previous stage cascade signal ST(n−2), a control signal of the thirty-seventh transistor T37 is connected to the reverse scanning signal Vsr, a second connecting terminal of the thirty-seventh transistor T37 is connected to a control terminal of the thirty-eighth transistor T38. A first connecting terminal of the thirty-eighth transistor T38 is connected to the low constant potential Vss, a second connecting terminal of the thirty-eighth transistor T38 is connected to the current stage scanning signal G(n).

The cancellation circuit 32 comprises a sixth transistor T6, a seventh transistor T7, a eighth transistor T8, and a ninth transistor T9. A first connecting terminal of the sixth transistor T6 is connected to CK(i−1), a control terminal of the sixth transistor T6 is connected to the scanning signal Vsf, a second connecting terminal of the sixth transistor T6 is connected to a control terminal of the seventh transistor T7. A first connecting terminal of the seventh transistor T7 is connected to the low constant potential Vss, a second connecting terminal of the seventh transistor T7 is connected to the current stage scanning signal G(n). A first connecting terminal of the eighth transistor T8 is connected to CK(i+1), a control terminal of the eighth transistor T8 is connected to the reverse scanning signal Vsr, a second connecting terminal of the eighth transistor T8 is connected to a control terminal of the ninth transistor T9. A first connecting terminal of the ninth transistor T9 is connected to the low constant potential Vss, a second connecting terminal of the ninth transistor T9 is connected to the current stage scanning signal G(n)

Wherein the control terminals of the transistors are gates. If the transistors are symmetrical, then the first connecting terminals are sources, the second connecting terminals are drains; or the first connecting terminals are drains, and the second connecting terminals are sources. If the transistors are not symmetrical, then the first connecting terminals are sources, the second connecting terminals are drains.

Please refer to FIG. 7, a GOA circuit is turned on according to an order of G(n)→G(n+1)→G(n+2) . . . , when the forward scanning signal Vsf is a high potential, and the reverse scanning signal Vsr is a low potential. Yet the GOA circuit is turned on according to an order of G(n+2)→G(n+1)→G(n) . . . , when the forward scanning signal Vsf is a low potential, and the reverse scanning signal is a high potential. The scanning directions can be switched by controlling the potentials of the forward scanning signal Vsf and the reverse scanning signal Vsr.

In FIG. 7, the first connecting terminal of the sixth transistor T6 is connected to CK(i−1), the control terminal of the sixth transistor T6 is connected to the forward scanning signal Vsf, the first connecting terminal of the eighth transistor T8 is connected to CK(i+1), the control terminal of the eighth transistor T8 is connected to the reverse scanning signal Vsr, which means that the cancellation circuit 32 is dropped down by CK(i−1) during the forward scanning process, and is dropped down by CK(i+1) during the reverse scanning process.

The first connecting terminal of the sixth transistor T6 can also be connected to CK(i+1), making the control terminal of the sixth transistor T6 being connected to the forward scanning signal Vsf, the first connecting terminal of the eighth transistor T8 being connected to CK(i−1), the control terminal of the eighth transistor T8 being connected to the reverse scanning signal Vsr, and the other connections remain the same; or the first connecting terminal of the sixth transistor T6 can also be connected to CK(i−1), making the control terminal of the sixth transistor T6 being connected to the reverse scanning signal Vsr, the first connecting terminal of the eighth transistor being connected to CK(i+1), the control terminal of the eighth transistor T8 being connected to the forward scanning signal Vsf, and th other connections remain the same. At this time, the cancellation circuit 32 is dropped down by CK(i+1) during the forward scanning process, and is dropped down by CK(i−1) during the reverse scanning process.

In one embodiment of the present disclosure, the cascade circuit comprises an output transistor, a control terminal of the output transistor is connected to a control node, a first connecting terminal of the output transistor is connected to a clock signal corresponding to a current stage, the second connecting terminal of the output transistor is connecting to a current stage scanning signal. Configuring an on-resistance ratio of the output transistor and the transistor connected to a low constant potential Vss and a current stage scanning signal in a cancellation circuit corresponding to the cascade circuit, so that in a pulse duration when the clock signals corresponding to the adjacent stage and the current stage are overlapped, a potential of the current stage scanning signal cannot turn on a TFT that being connected to the current stage scanning signal and used for charge sharing.

The present embodiment can be combined with any one of the embodiments from the second to the fourth embodiments according to the scan driving circuit in the present disclosure. When the present embodiment is combined with the scan driving circuit as descripted in the second embodiment, the output transistor is the thirteenth transistor T13, the control node is Q1, the transistor that connects with the low constant potential Vss and the current stage scanning signal is the first transistor T1.

In a pulse duration when the clock signals corresponding to the current stage and the adjacent stage cascade circuit are overlapped, the thirteenth transistor T13 and the first transistor T1 are both turned on, the clock signal CK(i) corresponding to the current stage is a high potential, at this time, the potential of the current stage scanning signal G(n) is $(V_{ss}R13+VHR1)/(R1+R13)$, wherein VH represents high potential of CK(i), R13 represents the on-resistance of the thirteenth transistor T13, R1 represents the on-resistance of the first transistor T1. It can be seen that, when the R13/R1 ratio getting greater, the potential of G(n) is more close to Vss. In order to drive the VA liquid crystal with wide viewing angle, the potential of G(n) has to be smaller than the turn-on voltage of the TFT used for charge sharing that is connected to G(n), the threshold of R13/R1 can be calculated according to the turn-on voltage of the TFT used for charge sharing. When the thirteenth transistor T13 and the first transistor T1 are FET, the on-resistance can be changed by adjusting the size of channel dimensions.

When the present embodiment is combined with the scan driving circuit as descripted in the third embodiment, the output transistor is the twenty-third transistor T23, the control node is Q2, the transistor that connects with the low constant potential Vss and the current stage scanning signal is the third transistor T3 and the fifth transistor T5. R23/R3 and R23/R5 should all meet the potential requirement of G(n) in the overlapping pulse duration, for details please refer to the description of the combination of the present embodiment and the second preferred embodiment. When the present embodiment is combined with the scan driving circuit as descripted in the fourth embodiment, the output transistor is the thirty-fourth transistor T34, the control node is Q3, the transistor that connects with the low constant potential Vss and the current stage scanning signal is the seventh transistor T7 and the ninth transistor T9. R34/R7 and R34/R9 should all meet the potential requirement of G(n) in the overlapping pulse duration, for details please refer to the description of the combination of the present embodiment and the second preferred embodiment.

Figure 9:
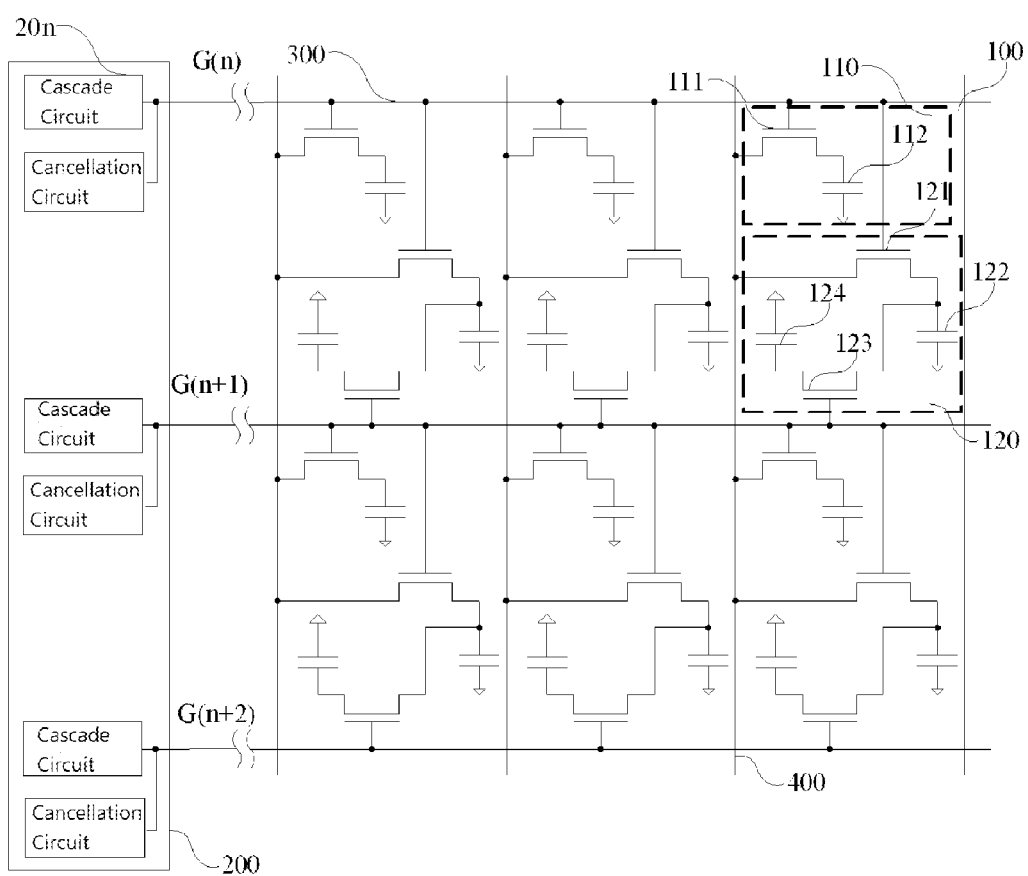
FIG. 9 is a schematic diagram of an array substrate according to a first preferred embodiment of the present disclosure.

As shown in FIG. 9, a first embodiment of an array substrate in the present disclosure comprises: a plurality of pixels arranged in array, a scan driving circuit 200, and a scan line 300 corresponding to a row where the pixels are disposed.

Take the pixel 100 for example, the pixel 100 comprises a main-region 110 and a sub-region 120, the main-region 110 comprises a first pixel electrode 112 and a first TFT 111, the sub-region 120 comprises a second pixel electrode 122, a coupling capacitor 124, a second TFT 121, and a third TFT 123. The structure of the other pixels is the same as the pixel 100.

In the main-region 110 of the pixel 100, a control terminal of the first TFT 111 is connected to a current scanning signal G(n) outputted from the n-th stage cascade circuit 20n corresponding to n-th row where the pixel 100 is disposed via the scan line 300, a first connecting terminal of the first TFT 111 is connected to a data line corresponding a column where the pixel 100 is disposed, a second connecting terminal of the first TFT 111 is connected to the first pixel electrode 112.

In the sub-region 120 of the pixel 100, a control terminal of the second TFT 121 is connected to the current scanning signal G(n) via the scan line, a first connecting terminal of the second TFT 121 is connected to the data line corresponding to the column where the pixel 100 is disposed, a second connecting terminal of the second TFT 121 is connected to the second pixel electrode 122 and a first connecting terminal of the third TFT 123; a control terminal of the third TFT 123 is connected to a current stage scanning signal G(n+1) outputted from a cascade circuit corresponding to a row next to the n-th row where the pixel is disposed, a second connecting terminal of the third TFT 123 is connected to the coupling capacitor 124.

Wherein the control terminal of the TFT is a gate. If the TFT is symmetrical, then the first connecting terminal is source, the second connecting terminal is drain; or the first connecting terminal is drain, the second connecting terminal is source. If the TFT is not symmetrical, then the first connecting terminal is source, the second connecting terminal is drain.

The scan driving circuit 200 can be any one of the embodiments and their combinations as descripted in the present disclosure, the scan driving circuit comprises a multi-stage cascade circuit and a plurality of cancellation circuits corresponding to each stage of the cascade circuit, the scanning signals outputted from two adjacent stages of the cascade circuit are not overlapped The working principle of the main-region 110 in each pixel 100 is the same as an ordinary pixel, which will be not repeated herein. For the sub-region 120, the potentials of the second pixel electrode and the data line are different after being charged. Later on, the control line of a next stage is turned on, where G(n+1) is high potential, G(n) is low potential, the third TFT is on, so as to connect the second pixel electrode 122 and the coupling capacitor 124, the potential of the second pixel electrode 122 is more close to that of a common electrode by the effect of the coupling capacitor, therefore a voltage difference is generated between two regions, a wide viewing angle is obtained.

In one embodiment of the array substrate of the present disclosure, the control terminal of the first TFT in each pixel and the control terminal of the third TFT in all the pixel on a row previous to the row where the pixel is disposed are connected to the current stage scanning signal outputted from the cascade circuit corresponding to the row where the pixel is disposed, via the same scan line.

The embodiments were chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A scan driving circuit on an array substrate, which comprises:

a multi-stage cascade circuit, each stage of the cascade circuit inputs a clock signal corresponding to a current stage, and outputs a current stage scanning signal and a current stage cascade signal, different stages of the cascade circuit are connected with each other via the cascade signal;

a plurality of cancellation circuits, each cancellation circuit is corresponding to one stage of the cascade circuit, the cancellation circuit corresponding to a current stage cascade circuit inputs a clock signal corresponding to an adjacent stage cascade circuit, and outputs a cancellation signal, the cancellation signal offsets a part of the current stage scanning signal outputted from the current stage cascade circuit, so that the scanning signals outputted from two adjacent stages of the cascade circuit are not overlapped;

a total group of the clock signals are m, wherein m is an even number, an average duty cycle of each clock signal is 50%, the current stage cascade circuit is a n-th stage, wherein n is a positive integer, the current stage cascade circuit is connected to a cascade signal ST (n−m/2) outputted from a (n−m/2) stage cascade circuit and a cascade signal ST (n+m/2) outputted from a (n+m/2) stage cascade circuit;

the cancellation circuit comprises a first transistor, a control terminal of the first transistor is connected a clock signal corresponding to the adjacent stage cascade circuit, a first connecting terminal of the first transistor is connected to a low constant potential Vss, a second connecting terminal of the first transistor is connected to the current stage scanning signal;

the cascade circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal;

configuring an on-resistance ratio of the output transistor and the first transistor, so that in a pulse duration when the clock signals corresponding to the adjacent stage and the current stage are overlapped, a potential of the current stage scanning signal cannot turn on a TFT that being connected to the current stage scanning signal and used for charge sharing.

2. A scan driving circuit on an array substrate, which comprises:

a multi-stage cascade circuit, each stage of the cascade circuit inputs a clock signal corresponding to a current stage, and outputs a current stage scanning signal and a current stage cascade signal, different stages of the cascade circuit are connected with each other via the cascade signal;

a plurality of cancellation circuits, each cancellation circuit is corresponding to one stage of the cascade circuit, the cancellation circuit corresponding to a current stage cascade circuit inputs a clock signal corresponding to an adjacent stage cascade circuit, and outputs a cancellation signal, the cancellation signal offsets a part of the current stage scanning signal outputted from the current stage cascade circuit, so that the scanning signals outputted from two adjacent stages of the cascade circuit are not overlapped.

3. The scan driving circuit as claimed in claim 2, wherein the cancellation circuit comprises a first transistor, a control terminal of the first transistor is connected a clock signal corresponding to the adjacent stage cascade circuit, a first connecting terminal of the first transistor is connected to a low constant potential Vss, a second connecting terminal of the first transistor is connected to the current stage scanning signal.

4. The scan driving circuit as claimed in claim 3, wherein the cascade circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal;
configuring an on-resistance ratio of the output transistor and the first transistor, so that in a pulse duration when the clock signals corresponding to the adjacent stage and the current stage are overlapped, a potential of the current stage scanning signal cannot turn on a TFT that being connected to the current stage scanning signal and used for charge sharing.

5. The scan driving circuit as claimed in claim 2, wherein the cancellation circuit comprises a second transistor, a third transistor, a fourth transistor, and a fifth transistor;
a first connecting terminal of the second transistor is connected to the clock signal corresponding to the adjacent stage cascade circuit, a control terminal of the second transistor is connected to a first control signal, a second connecting terminal of the second transistor is connected to a control terminal of the third transistor, a first connecting terminal of the third transistor is connected to a low constant potential Vss, a second connecting terminal of the third transistor is connected to the current stage scanning signal;
a first connecting terminal of the fourth transistor is connected to the clock signal corresponding to the adjacent stage cascade circuit, a control terminal of the fourth transistor is connected to a second control signal, a second connecting terminal of the fourth transistor is connected to a control terminal of the fifth transistor, a first connecting terminal of the fifth transistor is connected to the low constant potential Vss, a second connecting terminal of the fifth transistor is connected to the current stage scanning signal;
wherein a phase of the first control signal and a phase of the second control signal are opposite, frequencies of the first control signal and the second control signal are smaller than that of the clock signal.

6. The scan driving circuit as claimed in claim 5, wherein the cascade circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal;
configuring on-resistance ratios of the output transistor, the third transistor, and the fifth transistor, so that in a pulse duration when the clock signals corresponding to the adjacent stage and the current stage are overlapped, a potential of the current stage scanning signal cannot turn on a TFT that being connected to the current stage scanning signal and used for charge sharing.

7. The scan driving circuit as claimed in claim 2, wherein the cancellation circuit comprises a sixth transistor, a seventh transistor, an eighth transistor, and a ninth transistor;
a first connecting terminal of the sixth transistor is connected to the clock signal corresponding to the adjacent stage cascade circuit, a control terminal of the sixth transistor is connected to a forward scanning signal, a second connecting terminal of the sixth transistor is connected to a control terminal of the seventh transistor, a first connecting terminal of the seventh transistor is connected to a low constant potential Vss, a second connecting terminal of the seventh transistor is connected to the current stage scanning signal;
a first connecting terminal of the eighth transistor is connected to a clock signal corresponding to another adjacent stage cascade circuit, a control terminal of the eighth transistor is connected to a reverse scanning signal, a second connecting terminal of the eighth transistor is connected to a control terminal of the ninth transistor, a first connecting terminal of the ninth transistor is connected to the low constant potential Vss, a second connecting terminal of the ninth transistor is connected to the current stage scanning signal.

8. The scan driving circuit as claimed in claim 7, wherein the cascade circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal;
configuring on-resistance ratios of the output transistor, the seventh transistor, and the ninth transistor, so that in a pulse duration when the clock signals corresponding to the adjacent stage and the current stage are overlapped, a potential of the current stage scanning signal cannot turn on a TFT that being connected to the current stage scanning signal and used for charge sharing.

9. The scan driving circuit as claimed in claim 2, wherein a total group of the clock signals are m, wherein m is an even number, an average duty cycle of each clock signal is 50%, the current stage cascade circuit is a n-th stage, wherein n is a positive integer, the current stage cascade circuit is connected to a cascade signal ST (n−m/2) outputted from a (n−m/2) stage cascade circuit and a cascade signal ST (n+m/2) outputted from a (n+m/2) stage cascade circuit.

10. An array substrate comprising a scan driving circuit, wherein
the scan driving circuit comprises a multi-stage cascade circuit, each stage of the cascade circuit inputs a clock signal corresponding to a current stage, and outputs a current stage scanning signal and a current stage cascade signal, different stages of the cascade circuit are connected with each other via the cascade signal;

a plurality of cancellation circuits, each cancellation circuit is corresponding to one stage of the cascade circuit, the cancellation circuit corresponding to a current stage cascade circuit inputs a clock signal corresponding to an adjacent stage cascade circuit, and outputs a cancellation signal, the cancellation signal offsets a part of the current stage scanning signal outputted from the current stage cascade circuit, so that the scanning signals outputted from two adjacent stages of the cascade circuit are not overlapped.

11. The array substrate as claimed in claim 10, wherein the cancellation circuit of the scan driving circuit comprises a first transistor, a control terminal of the first transistor is connected a clock signal corresponding to the adjacent stage cascade circuit, a first connecting terminal of the first transistor is connected to a low constant potential Vss, a second connecting terminal of the first transistor is connected to the current stage scanning signal.

12. The array substrate as claimed in claim 10, wherein the cascade circuit of the scan driving circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal;
configuring an on-resistance ratio of the output transistor and the first transistor, so that in a pulse duration when the clock signals corresponding to the adjacent stage and the current stage are overlapped, a potential of the current stage scanning signal cannot turn on a TFT that being connected to the current stage scanning signal and used for charge sharing.

13. The array substrate as claimed in claim 10, wherein the cancellation circuit of the scan driving circuit comprises a second transistor, a third transistor, a fourth transistor, and a fifth transistor;
a first connecting terminal of the second transistor is connected to the clock signal corresponding to the adjacent stage cascade circuit, a control terminal of the second transistor is connected to a first control signal, a second connecting terminal of the second transistor is connected to a control terminal of the third transistor, a first connecting terminal of the third transistor is connected to a low constant potential Vss, a second connecting terminal of the third transistor is connected to the current stage scanning signal;
a first connecting terminal of the fourth transistor is connected to the clock signal corresponding to the adjacent stage cascade circuit, a control terminal of the fourth transistor is connected to a second control signal, a second connecting terminal of the fourth transistor is connected to a control terminal of the fifth transistor, a first connecting terminal of the fifth transistor is connected to the low constant potential Vss, a second connecting terminal of the fifth transistor is connected to the current stage scanning signal;
wherein a phase of the first control signal and a phase of the second control signal are opposite, frequencies of the first control signal and the second control signal are smaller than that of the clock signal.

14. The array substrate as claimed in claim 13, wherein the cascade circuit of the scan driving circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal;
configuring on-resistance ratios of the output transistor, the third transistor, and the fifth transistor, so that in a pulse duration when the clock signals corresponding to the adjacent stage and the current stage are overlapped, a potential of the current stage scanning signal cannot turn on a TFT that being connected to the current stage scanning signal and used for charge sharing.

15. The array substrate as claimed in claim 10, wherein the cancellation circuit of the scan driving circuit comprises a sixth transistor, a seventh transistor, an eighth transistor, and a ninth transistor;
a first connecting terminal of the sixth transistor is connected to the clock signal corresponding to the adjacent stage cascade circuit, a control terminal of the sixth transistor is connected to a forward scanning signal, a second connecting terminal of the sixth transistor is connected to a control terminal of the seventh transistor, a first connecting terminal of the seventh transistor is connected to a low constant potential Vss, a second connecting terminal of the seventh transistor is connected to the current stage scanning signal;
a first connecting terminal of the eighth transistor is connected to a clock signal corresponding to another adjacent stage cascade circuit, a control terminal of the eighth transistor is connected to a reverse scanning signal, a second connecting terminal of the eighth transistor is connected to a control terminal of the ninth transistor, a first connecting terminal of the ninth transistor is connected to the low constant potential Vss, a second connecting terminal of the ninth transistor is connected to the current stage scanning signal.

16. The array substrate as claimed in claim 15, wherein the cascade circuit of the scan driving circuit comprises an output transistor, a control terminal of the output transistor is connected to a control node, a first connecting terminal of the output transistor is connected to the clock signal corresponding to the current stage, a second connecting terminal of the output transistor is connected to the current stage scanning signal;
configuring on-resistance ratios of the output transistor, the seventh transistor, and the ninth transistor, so that in a pulse duration when the clock signals corresponding to the adjacent stage and the current stage are overlapped, a potential of the current stage scanning signal cannot turn on a TFT that being connected to the current stage scanning signal and used for charge sharing.

17. The array substrate as claimed in claim 10, wherein a total group of the clock signals are m, wherein m is an even number, an average duty cycle of each clock signal is 50%, the current stage cascade circuit is a n-th stage, wherein n is a positive integer, the current stage cascade circuit is connected to a cascade signal ST (n−m/2) outputted from a (n−m/2) stage cascade circuit and a cascade signal ST (n+m/2) outputted from a (n+m/2) stage cascade circuit.

18. The array substrate as claimed in claim 10, wherein the array substrate further comprises a plurality of pixels arranged in array, each of the pixels comprises a main-region and a sub-region, the main-region comprises a first pixel electrode and a first TFT, the sub-region comprises a second pixel electrode, a coupling capacitor, a second TFT, and a third TFT;
in the main-region of each pixel, a control terminal of the first TFT is connected to the current stage scanning signal outputted from the cascade circuit corresponding to a row where the pixel is disposed, a first connecting terminal of the first TFT is connected to a data line corresponding to a column where the pixel is disposed, a second connecting terminal of the first TFT is connected to the first pixel electrode;

in the sub-region of each pixel, a control terminal of the second TFT is connected to the current stage scanning signal outputted from the cascade circuit corresponding to the row where the pixel is disposed, a first connecting terminal of the second TFT is connected to the data line corresponding to the column where the pixel is disposed, a second connecting terminal of the second TFT is connected to the second pixel electrode and a first connecting terminal of the third TFT, a control terminal of the third TFT is connected to a scanning signal outputted from a cascade circuit corresponding to a row next to the row where the pixel is disposed, a second connecting terminal of the third TFT is connected to the coupling capacitor.

19. The array substrate as claimed in claim 18, wherein the array substrate further comprises scan lines corresponding to the pixels, the control terminal of the first TFT in each pixel and the control terminal of the third TFT in all the pixels on a row previous to the row where the pixel is disposed are connected to the current stage scanning signal outputted from the cascade circuit corresponding to the row where the pixel is disposed, via the same scan line.

* * * * *